United States Patent [19]
Hoshino

[11] Patent Number: 5,754,129
[45] Date of Patent: May 19, 1998

[54] DATA CONVERSION CIRCUIT

[75] Inventor: Taichi Hoshino, Kyoto, Japan

[73] Assignee: Rohm Co., Ltd., Kyoto, Japan

[21] Appl. No.: 804,087

[22] Filed: Feb. 20, 1997

[30] Foreign Application Priority Data

Mar. 25, 1996 [JP] Japan ................. 8-068574

[51] Int. Cl.$^6$ ................. H03M 9/00
[52] U.S. Cl. ................. 341/100
[58] Field of Search ................. 341/100, 94, 101, 341/118

[56] References Cited

U.S. PATENT DOCUMENTS 5,541,596 7/1996 Yoshida ................. 341/100
5,561,423 10/1996 Morisaki ................. 341/100

*Primary Examiner*—Brian K. Young
*Attorney, Agent, or Firm*—Keiichi Nishimura

[57] ABSTRACT

A data conversion circuit has an input terminal for receiving serial data as time-divided multiple signals, a plurality of sample-and-hold circuits each connected to the input terminal, and output terminals each connected to an associated one of these sample-and-hold circuits to output the received signals as parallel data. At least one of these sample-and-hold circuits is formed with a first switch circuit which is connected on one side to the input terminal and is adapted to be switched on according to a first timing, a second switch circuit which is connected on one side to the input terminal and is adapted to be switched on according to a second timing different from the first timing, a first capacitor and a second capacitor connected respectively to the other side of the first and second switch circuits for holding received data, a third switch circuit having a common contact and being adapted to connect the common contact selectively either to the first capacitor or to the second capacitor according to a third timing different from the first timing and the second timing, and an amplifier connected between the common contact of the third switch circuit and the output terminal to output data from selected one of the capacitors.

5 Claims, 3 Drawing Sheets

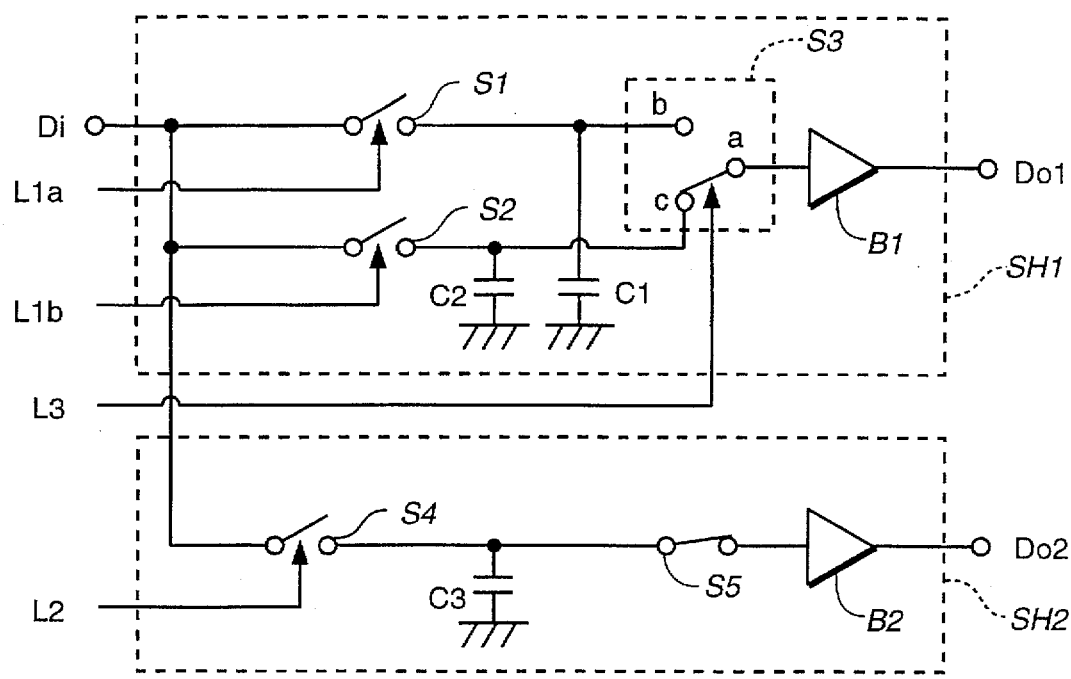
FIG._1
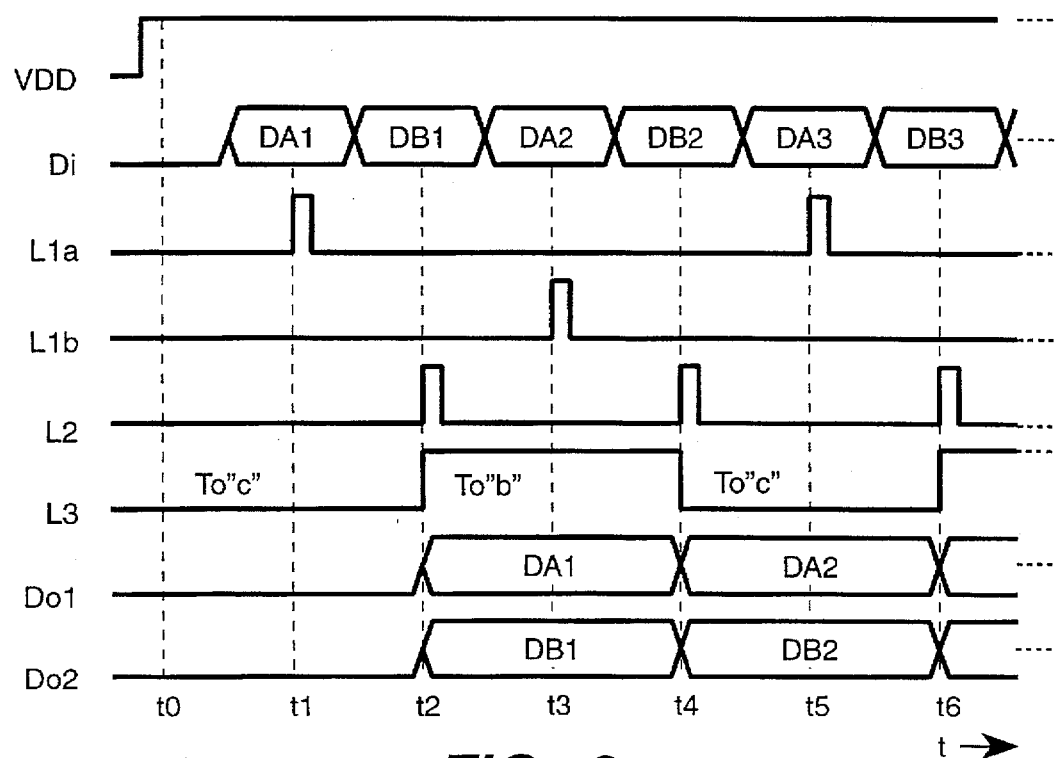
FIG._2

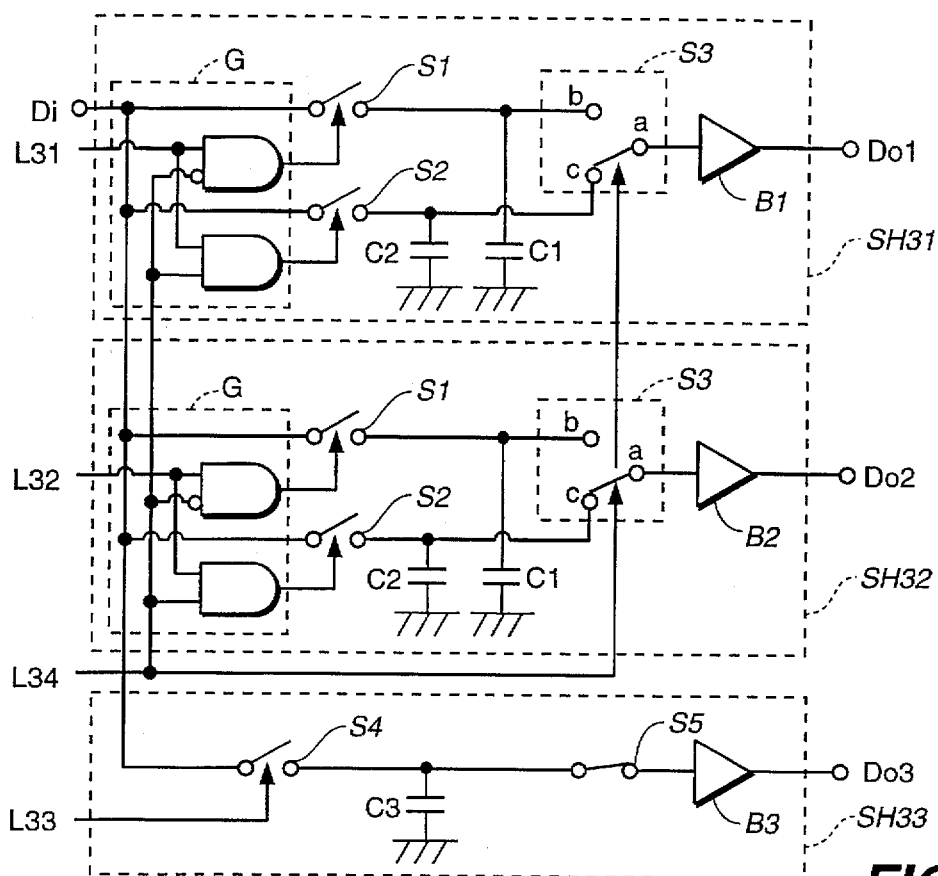
FIG._3
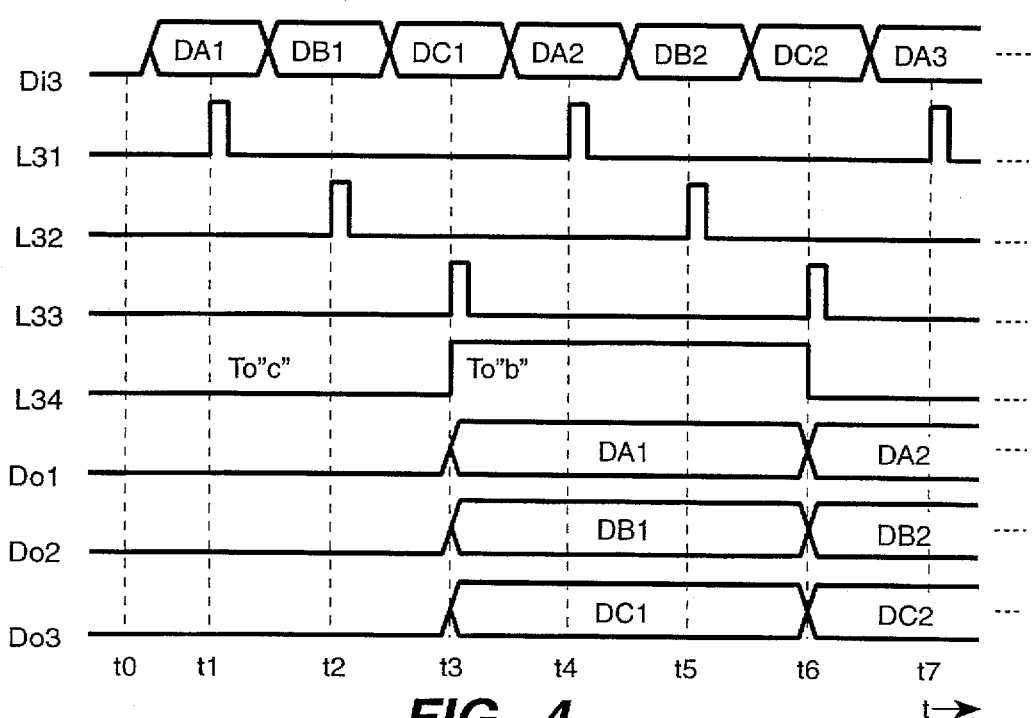
FIG._4

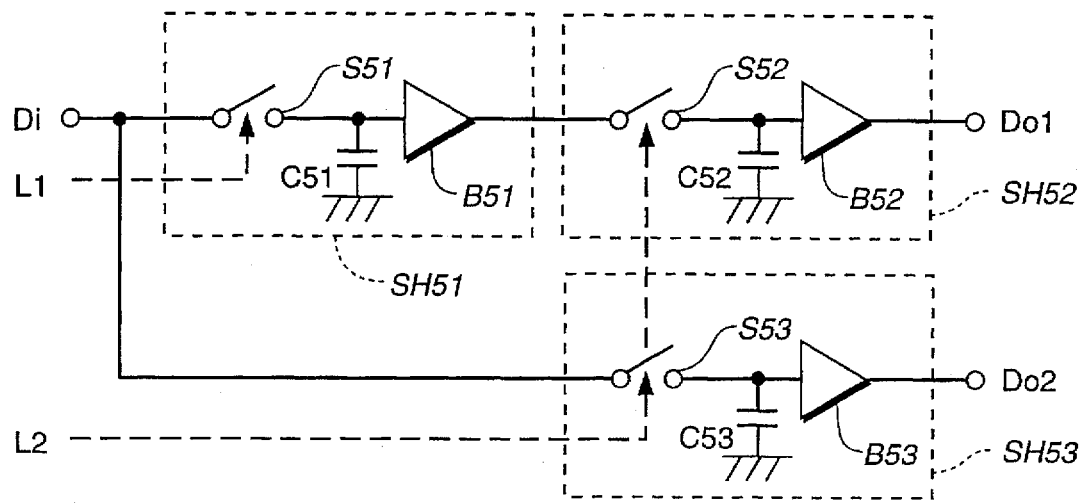
FIG._5
(PRIOR ART)
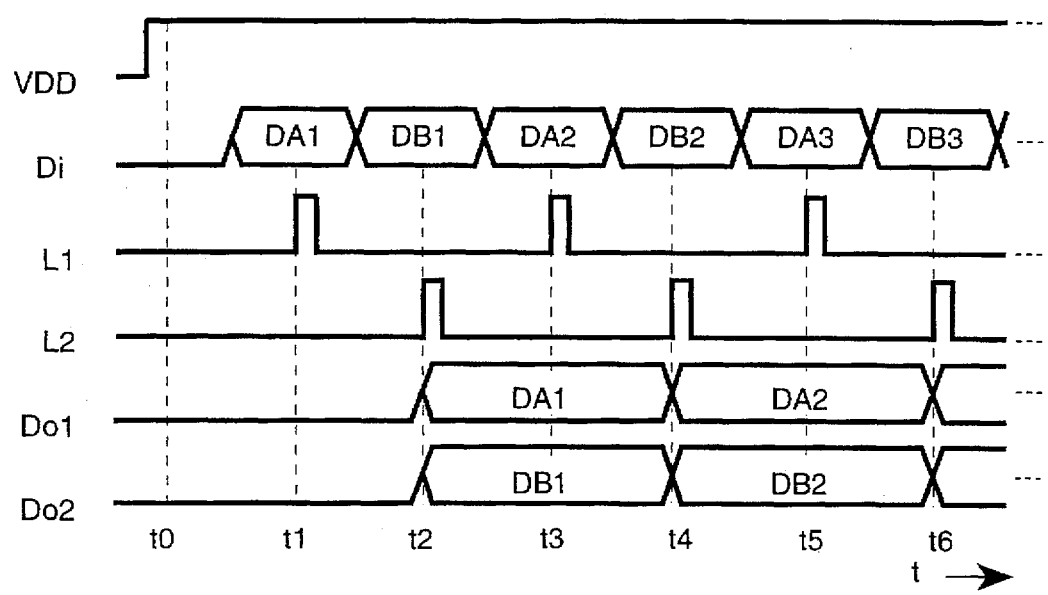
FIG._6
(PRIOR ART)

DATA CONVERSION CIRCUIT

BACKGROUND OF THE INVENTION

This invention relates to a data conversion circuit for converting serial data, inputted as time-divided multiple signals, and outputting them as parallel data. In particular, this invention relates to the structure of such a circuit.

Data conversion circuits, structured as shown in FIG. 5, have been in use for receiving time-divided serial data at a specified timing, holding them, and outputting them as parallel data. The data conversion circuit shown in FIG. 5 is for converting serial data including two kinds of data into two kinds of parallel data, and may be characterized as comprising an input terminal Di for receiving the serial data, sample-and-hold circuits SH51, SH52 and SH53, output terminals Do1 and Do2 for the parallel data, and control lines L1 and L2. Each sample-and-hold circuit SH5m (where m=1, 2 or 3) is composed of a capacitor C5m, a switch circuit S5m and an amplifier B5m, and the control lines L1 and L2 serve to control the switching of these switching circuits S51, S52 and S53 such that each switching circuit will be in a non-conducting condition (or the OFF condition) when a low-level signal is applied and in a conducting condition (or the ON condition) when a high-level signal is applied.

The data conversion operation by the circuit of FIG. 5 will be explained next by way of the timing chart shown in FIG. 6. When a source voltage VDD is initially applied at time t0 to activate the circuit, each switch circuit is in the OFF condition because the voltage of each control line is at a low level, and both output terminals output a low-level signal. If alternately time-divided serial data of two kinds DAn and DBn (where n takes values of positive integers) are then inputted through the input terminal Di, starting at time t1 as shown in FIG. 6, control line L1 controls switch circuit S51 to be switched on for a specified length of time such that data item DA1 is taken in on capacitor C51 and held thereon. At time t2, as data item DB1 is received, control line L2 controls switch circuits S52 and S53 to switch them on and to keep them in the ON condition for a specified length of time. This not only causes data item DA1 to be shifted to capacitor C52 and data item DB1 to be taken in on capacitor C53, but also causes them to be outputted from the output terminals Do1 and Do2 through amplifiers B52 and B53, respectively. At time t3, as data item DA2 is received, only switch circuit S51 is switched on such that data item DA2 is taken in on capacitor C51 and held thereon, but output terminal Do1 continues to output data item DA1. At time t4, switch circuits S52 and S53 are switched on for a specified length of time such that data items DA2 and DB2 are not only taken in and held respectively on capacitors C52 and C53 but also outputted as parallel data respectively from the output terminals Do1 and Do2 after being amplified by amplifiers B52 and B53. Operations as described above are repeated such that two kinds of time-divided serial data can be outputted as two kinds of parallel data.

With the data conversion circuit of FIG. 5, those of the inputted data which are outputted from output terminal Do2 are passed through only one sample-and-hold circuit (SH53), but those outputted from output terminal Do1 are passed through two sample-and-hold circuits (SH51 and SH52). In the case of digital data, the only problem with this circuit is that there are too many amplifiers and hence it is difficult to reduce the area of the semiconductor chip therefor. In the case of analog data which have been analog-converted by means of a digital-to-analog (D/A) converter with 8 bits or more, however, effects of offset voltages and noise of amplifiers B51 and B52 on the output from output terminal Do1 are doubly significant. Errors caused thereby may be significant, and the outputs from the two output terminals Do1 and Do2 become uneven. Thus, a data conversion circuit of this kind cannot effectively be used for the conversion of multi-valued data.

SUMMARY OF THE INVENTION

It is therefore an object of this invention to eliminate such problems of prior art data conversion circuits by providing an improved data conversion circuit capable of converting multiply time-divided serial analog data into parallel data and outputting them as a matched set of (parallel) data.

It is another object of this invention to provide such data conversion circuits which have a simple circuit structure and can be formed easily and inexpensively.

A data conversion circuit embodying this invention, with which the above and other objects can be accomplished, may be characterized not only as comprising an input terminal for receiving serial data as time-divided multiple signals, a plurality of sample-and-hold circuits each connected to the input terminal, and output terminals each connected to an associated one of these sample-and-hold circuits to output the received signals as parallel data, but also wherein at least one of these sample-and-hold circuits comprises a first switch circuit which is connected on one side to the input terminal and is adapted to be switched on according to a first timing, a second switch circuit which is connected on one side to the input terminal and is adapted to be switched on according to a second timing different from the first timing, a first capacitor and a second capacitor connected respectively to the other side of the first and second switch circuits for holding received data, a third switch circuit having a common contact and being adapted to connect the common contact selectively either to the first capacitor or to the second capacitor according to a third timing different from the first timing and the second timing, and an amplifier connected between the common contact of the third switch circuit and the output terminal associated with this sample-and-hold circuit to output data from selected one of the capacitors. Another of the sample-and-hold circuits comprises a (fourth) switch circuit which is connected on one side to the input terminal and is adapted to be switched on according to a timing different from the aforementioned first timing, second timing and third timing, a capacitor connected to the other side of this switch circuit for holding received data, an always-closed switch circuit which is connected also to the other side of the (fourth) switch circuit, and an amplifier connected between the always-closed switch and the output terminal associated with this sample-and-hold circuit.

With a data conversion circuit thus formed, data items outputted from different output terminals as parallel data travel through different but substantially equivalent routes. Thus, multiple-valued serial analog data can be successfully converted into parallel data with hardly any conversion errors by these sample-and-hold circuits.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a block diagram of a circuit embodying this invention;

FIG. 2 is a timing chart of the circuit shown in FIG. 1;

FIG. 3 is a block diagram of another circuit embodying this invention;

FIG. 4 is a timing chart of the circuit shown in FIG. 3;

FIG. 5 is a block diagram of a prior art data conversion circuit; and

FIG. 6 is a timing chart of the prior art circuit shown in FIG. 5.

Throughout herein, components which are substantially the same or equivalent are indicated by the same symbols and may not be repetitively explained for the simplicity of disclosure.

DETAILED DESCRIPTION OF THE INVENTION

FIG. 1 represents a data conversion circuit embodying this invention, which may be a part of a semiconductor device such as a one-chip microcomputer, being adapted to convert two kinds of analog data being inputted as time-divided serial data and to output them as two kinds of parallel data, and comprising an input terminal Di where serial data are inputted, (first and second) sample-and-hold circuits SH1 and SH2 which are each connected to the input terminal Di and each serve to hold and output received data, output terminals Do1 and Do2 which are connected respectively to the sample-and-hold circuits for outputting data, and control (signal) lines L1a, L1b, L2 and L3 for carrying out sampling control of each sample-and-hold circuit.

The first sample-and-hold circuit SH1 comprises (first and second) switch circuits S1 and S2, each serving as an on-off switch with one contact connected to the input terminal Di, and a (third) switch circuit S3 having a common contact ("a") and two contacts "b" and "c" connected each to the other contact to corresponding one of the switch circuits S1 and S2 to serve as a two-way switch. Capacitor C1 is connected to a connecting line between the first switch circuit S1 and contact "b" of the third switch circuit S3 and capacitor C2 is connected to a connection line between the second switch circuit S2 and contact "c" of the third switch circuit S3 for holding data from the input terminal Di. An amplifier B1 is connected between output terminal Do1 and the common contact "a" of the third switch circuit S3.

The second sample-and-hold circuit SH2 comprises a (fourth) switch circuit S4 with one contact connected to the input terminal Di and another (fifth) switch circuit S5 which is always in the ON condition, with one contact connected to the other contact of the fourth switch circuit S4 so as to provide a dummy load (or artificial load) corresponding to the aforementioned third switch circuit S3. Capacitor C3 for holding data is connected to a line between switch circuits S4 and S5, and an amplifier B2 is connected between the other contact of the fifth switch circuit S5 and output terminal Do2. Control lines L1a, L1b, L2 and L3 are connected respectively to switch circuits S1, S2, S4 and S3. Each switch circuit is an ordinary analog switch circuit using PMOS and NMOS transistors, each amplifier comprises an operational amplifier circuit, and each capacitor is formed between a diffusion layer and a wiring layer or between two wiring layers.

Operations of the data conversion circuit of FIG. 1 will be explained next with reference to the timing chart shown in FIG. 2. When a source voltage VDD is applied (not shown) at time t0 to activate the circuit, each control line is at a lower-level voltage and hence switch circuits S1, S2 and S4 are all in the OFF condition, and switch circuit S3 is connected to the side of contact "c". Since the source voltage VDD is applied when each capacitor is in discharged condition, low-level signals are outputted from the output terminals Do1 and Do2.

Let us assume that time-divided serial data with two kinds of analog voltage data DAn and DBn (n being positive integers) are inputted to the input terminal Di. At time t1, as data item DA1 is received through the input terminal Di, a signal through control line L1a causes first switch circuit S1 to be switched on for a specified length of time and data item DA1 is taken in and held on capacitor C1. Next, at time t2, as data item DB1 is received, a signal through control line L2 causes fourth switch circuit S4 to be switched on for a specified length of time, causing data item DB1 to be taken in and held on capacitor C3, and a signal through control line L3 switches the third switch circuit S3 to the side of contact "b", causing data items DA1 and DB1 held respectively on capacitors C1 and C3 to be outputted as parallel data, respectively through amplifiers B1 and B2 and respectively from output terminals Do1 and Do2.

At time t3, as data item DA2 is received while data items DA1 and DB1 are being outputted as described above, a signal through control line L1b causes second switch circuit S2 to be switched on for a specified length of time, causing data item DA2 to be taken in and held on capacitor C2. Next, at time t4, as data item DB2 is received, signals through control lines L2 and L3 cause switch circuit S4 to be switched on for a specified length of time and switch circuit S3 to be connected to the side of contact "c", causing data items DA2 and DB2 held respectively on capacitors C2 and C3 to be outputted as parallel data, respectively from output terminals Do1 and Do2. Operations as described above are repeated such that two kinds of time-divided serial data can be outputted as two kinds of parallel data.

In summary, a control signal is transmitted through control line L1a only when data item DAn with an odd n-value is being received and through control line L1b only when data item DAn with an even n-value is being received, while a control signal is transmitted through control line L2 every time data item DBn is received.

FIG. 3 represents another data conversion circuit embodying this invention adapted to convert three kinds of analog data inputted as time-divided serial data and to output them as three kinds of parallel data. It comprises an input terminal Di for receiving the serial data, three sample-and-hold circuits SH31, SH32 and SH33, output terminals Do1, Do2 and Do3 each connected to an associated one of the three sample-and-hold circuits, and control lines L31, L32, L33 and L34 for controlling sampling operations of the sample-and-hold circuits. The structure of sample-and-hold circuits SH31 and SH32 is the same as that of sample-and-hold circuit SH1 shown in and explained above with reference to FIG. 1 (equivalent components thereof being therefore indicated by the same symbols) except there is inserted a timing circuit G for generating a control signal from control line L31 or L32 which corresponds to control lines L1a and L1b shown in FIG. 1. The structure of sample-and-hold circuit SH33 is similar to that of sample-and-hold circuit SH2 of FIG. 1.

Operations of the data conversion circuit of FIG. 3 is explained next with reference to the timing chart shown in FIG. 4. As in the case of FIGS. 1 and 2, each control line is at a lower-level voltage initially (at time t0) and hence switch circuits S1, S2 and S4 are all in the OFF condition, and switch circuits S3 are both connected to the side of their contact "c". Thus, low-level signals are outputted initially from all of the output terminals. Each timing circuit G is structured so as to select, by a signal through control line L34, whichever of capacitors C1 and C2 not connected to the amplifier B1 or B2, switching on the corresponding one of the switch circuits S1 and S2 by a signal through control line L31 or L32 to cause the associated capacitor C1 or C2 to take in and hold the data item which is to be received next.

Let us assume that time-divided serial data with analog data DAn, DBn and DCn (n being positive integers) are inputted to the input terminal Di. At time t1, as data item DA1 is received through the input terminal Di, a signal through control line L31 causes switch circuit S1 of the sample-and-hold circuit SH31 to be switched on for a specified length of time and data item DA1 is taken in and held on capacitor C1 (of SH31). At time t2, a signal through control line L32 switches on switch circuit S1 of sample-and-hold circuit SH32 for a specified length of time and data item DB1 is taken in and held on capacitor C1 (of SH32). At time t3, signals through control lines L33 and L34 cause switch circuit S4 to be switched on for a specified length of time and switch circuits S3 to connect to their "b" contacts. As a result, data items DA1, DB1 and DC1 are outputted as parallel data from the output terminals Do1, Do2 and Do3.

At time t4, while data items DA1, DB1 and DC1 remain held, switch circuit S2 of sample-and-hold circuit SH31 is switched on for a specified length of time by a signal through control line L31 to have data item DA2 taken in and held on associated capacitor C2 (of SH31). At time t5, switch circuit S2 of sample-and-hold circuit SH32 is switched on for a specified length of time by a signal through control line L32 to have data item DB2 taken in and held on associated capacitor C2 (of SH32). At time t6, switch circuit S4 is switched on for a specified length of time by a signal through control line L33 and switch circuits S3 of both sample-and-hold circuits SH31 and SH32 are connected to their "c" contacts by a signal through control line L34, causing data items DA2, DB2 and DC2 to be outputted as parallel data from the output terminals Do1, Do2 and Do3, respectively. Operations as described above are repeated such that three time-divided serial data can be converted into and outputted as three parallel data.

Although the invention has been described above by way of only two examples for situations of converting two and three kinds of data inputted as time-divided serial data, these examples are not intended to limit the scope of the invention. It should be understood from the description above that this invention can be applicable to conversion of data of more kinds (that is, multiple data with multiplicity greater than 3). Many further modifications and variations are possible within the scope of this invention. For example, switch circuits S5 in FIGS. 1 and 3 may be replaced by another one similar to switch circuit S3 in order to equalize resistance and capacitance through different signal routes, or may be omitted when analog signals of only a few kinds are converted and high accuracy is not required. Instead of operational amplifier circuits, use may be made of CMOS inverter circuits or NAND circuits.

In summary, the routes taken by the individual data items inputted as serial data and outputted as parallel data according to this invention are substantially equivalent electronically, each having substantially the same resistance and capacitance. Thus, multiple-valued serial analog data can be successfully converted into parallel data with hardly any conversion errors by the series of sample-and-hold circuits. Moreover, this invention can minimize the errors among the sample-and-hold circuits due to effects of leak currents and noise on analog values being held. Conversion circuits pf this invention are of a simple circuit structure with only a small number of signal lines for handling data with a high multiplicity. If such a data conversion circuit is used on a bus line for a semiconductor device such as a one-chip microcomputer, the number of lines in the bus can be significantly reduced, and this can serve to reduce the required area of the semiconductor chip and also its production cost.

What is claimed is:

1. A data conversion circuit comprising:

an input terminal for receiving serial data as time-divided multiple signals;

a plurality of sample-and-hold circuits each connected to said input terminal; and output terminals each connected to an associated one of said sample-and-hold circuits, serving to output said received signals as parallel data;

at least one of said sample-and-hold circuits being of a kind comprising:

a first switch circuit which is connected on one side to said input terminal and is adapted to be switched on according to a first timing;

a second switch circuit which is connected on one side to said input terminal and is adapted to be switched on according to a second timing different from said first timing;

a first capacitor and a second capacitor connected respectively to the other side of said first and second switch circuits for holding received data;

a third switch circuit having a common contact and being adapted to connect said common contact selectively either to said first capacitor or to said second capacitor according to a third timing different from said first timing and said second timing; and an amplifier connected between said common contact of said third switch circuit and said output terminal to amplify data from selected one of said capacitors.

2. The data conversion circuit of claim 1 wherein said at least one sample-and-hold circuit further comprises control lines connected individually to said first, second and third switch circuits and are adapted to transmit control signals respectively at said first timing, said second timing and said third timing.

3. The data conversion circuit of claim 1 further comprising another kind of sample-and-hold circuit which includes:

a fourth switch circuit which is connected on one side to said input terminal and is adapted to be switched on according to a fourth timing different from said first timing, said second timing and said third timing;

a third capacitor connected to the other side of said fourth switch circuit for holding received data;

a fifth switch circuit which is connected to said other side of said fourth switch circuit and is always in a conducting condition; and another amplifier connected between said fifth switch and a corresponding one of said output terminals.

4. The data conversion circuit of claim 3 wherein said another kind of sample-and-hold circuit further comprises another control line which is connected to said fourth switch-and-hold circuit and is adapted to transmit control signals at said fourth timing.

5. The data conversion circuit of claim 3 wherein said fifth switch circuit provides a dummy load corresponding to said third switch circuit.

* * * * *